United States Patent [19]

Parizhsky

[11] Patent Number: 5,588,028
[45] Date of Patent: Dec. 24, 1996

[54] SIMPLIFIED TRELLIS DECODER

[75] Inventor: Vladimir Parizhsky, Chicago, Ill.

[73] Assignee: U.S. Robotics, Skokie, Ill.

[21] Appl. No.: 468,723

[22] Filed: Jun. 6, 1995

Related U.S. Application Data

[63] Continuation of Ser. No. 299,888, Sep. 1, 1994, abandoned, which is a continuation of Ser. No. 12,525, Feb. 2, 1993, abandoned.

[51] Int. Cl.$^6$ .................................................. H04L 27/22
[52] U.S. Cl. .............................................. 375/341; 371/43
[58] Field of Search .................................. 375/261, 265, 375/341, 340, 262, 263, 264, 298, 346, 348; 371/43, 44, 45, 41; 329/304, 305; 332/103

[56] References Cited

U.S. PATENT DOCUMENTS

| | | | |
|---|---|---|---|
| 4,713,817 | 12/1987 | Wei | 371/270 |
| 4,748,626 | 5/1988 | Wong | 371/340 |
| 4,873,701 | 10/1989 | Tretter | 375/244 |
| 5,050,191 | 9/1991 | No | 375/340 |
| 5,111,483 | 5/1992 | Serfaty | 375/340 |
| 5,191,589 | 3/1993 | Backstrom et al. | 375/267 |
| 5,233,629 | 8/1993 | Paik et al. | 375/230 |
| 5,287,385 | 2/1994 | Sugawara et al. | 375/262 |

OTHER PUBLICATIONS

Yashima et al, "A New Type of Viterbi Decoding with Path Reduction," Globecom '89: IEEE Global Telecommunications 1989, pp. 1714–1718.

*Primary Examiner*—Young T. Tse
*Assistant Examiner*—Bryan E. Webster
*Attorney, Agent, or Firm*—Banner & Witcoff, Ltd.

[57] ABSTRACT

A method and apparatus for processing convolution coded data. The method and apparatus have lower computational requirements, while still reducing or eliminating errors caused by noise or distortion. A path metric value associated with each decoder state is updated upon the receipt of each incoming signal value. The path metric value is formed by: (1) identifying those permissible transition(s) to that decoder state that are represented by symbols having the minimum branch metric compared to the received signal value; (2) identifying those permissible transition(s) to that decoder state that originate from states with the minimum previously-computed path metric value; and (3) comparing the transitions identified in the first and second steps. From this comparison, the identity of the transition with the lowest path metric value is derived. Thereafter, the path metric chosen is stored for that given state.

11 Claims, 8 Drawing Sheets

FIGURE 5A

| To State | Transition Codes | | | | | | | | | | | | | | | |
|---|---|---|---|---|---|---|---|---|---|---|---|---|---|---|---|---|
| 0 | 0 | 11 | 9 | 2 | 1 | 10 | 8 | 3 | 4 | 14 | 13 | 7 | 5 | 15 | 12 | 6 |
| 1 | 4 | 15 | 13 | 6 | 5 | 14 | 12 | 7 | 0 | 10 | 9 | 3 | 1 | 11 | 8 | 2 |
| 2 | 2 | 9 | 11 | 0 | 3 | 8 | 10 | 1 | 15 | 5 | 6 | 14 | 4 | 13 | 12 | 7 |
| 3 | 6 | 13 | 15 | 4 | 7 | 12 | 14 | 5 | 11 | 1 | 2 | 10 | 0 | 9 | 8 | 3 |
| 4 | 1 | 10 | 8 | 3 | 0 | 11 | 9 | 2 | 5 | 15 | 12 | 6 | 4 | 14 | 13 | 7 |
| 5 | 5 | 14 | 12 | 7 | 4 | 15 | 13 | 6 | 1 | 11 | 8 | 2 | 0 | 10 | 9 | 3 |
| 6 | 3 | 8 | 10 | 1 | 2 | 9 | 11 | 0 | 13 | 7 | 4 | 12 | 6 | 14 | 15 | 12 |
| 7 | 7 | 12 | 14 | 5 | 6 | 13 | 15 | 4 | 3 | 15 | 0 | 14 | 11 | 13 | 2 | 8 |
| 8 | 8 | 3 | 1 | 10 | 9 | 2 | 0 | 11 | 14 | 4 | 5 | 13 | 15 | 7 | 4 | 14 |
| 9 | 12 | 7 | 5 | 14 | 13 | 6 | 4 | 15 | 10 | 0 | 9 | 1 | 11 | 3 | 0 | 10 |
| 10 | 10 | 1 | 3 | 8 | 11 | 0 | 2 | 9 | 4 | 14 | 7 | 13 | 8 | 10 | 15 | 5 |
| 11 | 14 | 5 | 7 | 12 | 15 | 4 | 6 | 13 | 0 | 10 | 3 | 9 | 12 | 14 | 11 | 1 |
| 12 | 9 | 2 | 0 | 11 | 8 | 3 | 1 | 10 | 7 | 13 | 14 | 4 | 5 | 11 | 15 |
| 13 | 13 | 6 | 4 | 15 | 12 | 7 | 5 | 14 | 3 | 9 | 10 | 0 | 6 | 12 | 1 | 4 |
| 14 | 11 | 0 | 2 | 9 | 10 | 1 | 3 | 8 | 13 | 7 | 4 | 12 | 6 | 2 | 14 | 0 |
| 15 | 15 | 4 | 6 | 13 | 14 | 5 | 7 | 12 | 9 | 2 | 0 | 11 | 8 | 3 | 10 |

| To | Source States | | | | | | | | | | | | | | | |
|---|---|---|---|---|---|---|---|---|---|---|---|---|---|---|---|---|
| 0 – 15 | 0 | 4 | 8 | 12 | 16 | 20 | 24 | 28 | 32 | 36 | 40 | 44 | 48 | 52 | 56 | 60 |

TRANSITION CODES

| To State | | | | | | | | | | | | | | | | |
|---|---|---|---|---|---|---|---|---|---|---|---|---|---|---|---|---|
| 16 | 16 | 27 | 25 | 18 | 17 | 26 | 24 | 19 | 20 | 30 | 29 | 23 | 21 | 31 | 28 | 22 |
| 17 | 20 | 31 | 29 | 22 | 21 | 30 | 28 | 23 | 16 | 26 | 25 | 19 | 17 | 27 | 24 | 18 |
| 18 | 18 | 25 | 27 | 16 | 19 | 24 | 26 | 17 | 31 | 28 | 22 | 21 | 30 | 20 | 23 | 29 |
| 19 | 22 | 29 | 31 | 20 | 23 | 28 | 30 | 21 | 27 | 24 | 18 | 17 | 26 | 16 | 19 | 25 |
| 20 | 17 | 26 | 24 | 19 | 16 | 27 | 25 | 18 | 21 | 31 | 28 | 22 | 20 | 30 | 29 | 23 |
| 21 | 21 | 30 | 28 | 23 | 20 | 31 | 29 | 22 | 17 | 27 | 24 | 18 | 16 | 26 | 25 | 19 |
| 22 | 19 | 24 | 26 | 17 | 18 | 25 | 27 | 16 | 30 | 20 | 23 | 29 | 31 | 21 | 22 | 28 |
| 23 | 23 | 28 | 30 | 21 | 22 | 29 | 31 | 20 | 26 | 16 | 19 | 25 | 27 | 17 | 18 | 24 |
| 24 | 24 | 19 | 17 | 26 | 25 | 18 | 16 | 27 | 28 | 22 | 21 | 31 | 29 | 23 | 20 | 30 |
| 25 | 28 | 23 | 21 | 30 | 29 | 22 | 20 | 31 | 24 | 18 | 17 | 27 | 25 | 19 | 16 | 26 |
| 26 | 26 | 17 | 19 | 24 | 27 | 16 | 18 | 25 | 22 | 28 | 29 | 23 | 21 | 31 | 30 | 20 |
| 27 | 30 | 21 | 23 | 28 | 31 | 20 | 22 | 29 | 18 | 24 | 25 | 19 | 17 | 27 | 26 | 16 |
| 28 | 25 | 18 | 16 | 27 | 24 | 19 | 17 | 26 | 29 | 23 | 20 | 30 | 28 | 22 | 31 | 21 |
| 29 | 29 | 22 | 20 | 31 | 28 | 23 | 21 | 30 | 25 | 19 | 16 | 26 | 24 | 18 | 27 | 17 |
| 30 | 27 | 16 | 18 | 25 | 26 | 17 | 19 | 24 | 23 | 29 | 30 | 20 | 22 | 28 | 21 | 31 |
| 31 | 31 | 20 | 22 | 29 | 30 | 21 | 23 | 28 | 19 | 25 | 24 | 18 | 16 | 26 | 27 | 17 |

FIGURE 6B

| To | SOURCE STATES | | | | | | | | | | | | | | | |
|---|---|---|---|---|---|---|---|---|---|---|---|---|---|---|---|---|
| 15 – 31 | 1 | 5 | 9 | 13 | 17 | 21 | 25 | 29 | 33 | 37 | 41 | 45 | 49 | 53 | 57 | 61 |

FIGURE 5C

TRANSITION CODES

| To State | | | | | | | | | | | | | | | | |
|---|---|---|---|---|---|---|---|---|---|---|---|---|---|---|---|---|
| 32 | 4 | 15 | 13 | 6 | 5 | 14 | 12 | 7 | 3 | 10 | 0 | 8 | 2 | 10 | 1 | 11 |
| 33 | 0 | 11 | 9 | 2 | 1 | 10 | 8 | 3 | 7 | 14 | 4 | 12 | 6 | 14 | 5 | 15 |
| 34 | 6 | 13 | 15 | 4 | 7 | 12 | 14 | 5 | 8 | 3 | 11 | 0 | 9 | 1 | 10 | 0 |
| 35 | 2 | 9 | 11 | 0 | 3 | 8 | 10 | 1 | 12 | 7 | 15 | 4 | 13 | 5 | 14 | 4 |
| 36 | 5 | 14 | 12 | 7 | 4 | 15 | 13 | 6 | 0 | 11 | 9 | 2 | 1 | 11 | 0 | 10 |
| 37 | 1 | 10 | 8 | 3 | 0 | 11 | 9 | 2 | 4 | 15 | 13 | 6 | 5 | 15 | 4 | 14 |
| 38 | 7 | 12 | 14 | 5 | 6 | 13 | 15 | 4 | 11 | 2 | 10 | 1 | 14 | 0 | 11 | 1 |
| 39 | 3 | 8 | 10 | 1 | 2 | 9 | 11 | 0 | 15 | 6 | 14 | 5 | 10 | 4 | 15 | 5 |
| 40 | 12 | 7 | 5 | 14 | 13 | 6 | 4 | 15 | 11 | 0 | 2 | 9 | 10 | 2 | 8 | 3 |
| 41 | 8 | 3 | 1 | 10 | 9 | 2 | 0 | 11 | 15 | 4 | 6 | 13 | 14 | 6 | 12 | 7 |
| 42 | 14 | 5 | 7 | 12 | 15 | 4 | 6 | 13 | 0 | 11 | 9 | 2 | 3 | 9 | 3 | 8 |
| 43 | 10 | 1 | 3 | 8 | 11 | 0 | 2 | 9 | 4 | 15 | 13 | 6 | 7 | 13 | 7 | 12 |
| 44 | 13 | 6 | 4 | 15 | 12 | 7 | 5 | 14 | 0 | 11 | 3 | 8 | 9 | 3 | 9 | 2 |
| 45 | 9 | 2 | 0 | 11 | 8 | 3 | 1 | 10 | 4 | 15 | 7 | 12 | 13 | 7 | 13 | 6 |
| 46 | 15 | 4 | 6 | 13 | 14 | 5 | 7 | 12 | 11 | 0 | 10 | 1 | 2 | 10 | 0 | 9 |
| 47 | 11 | 0 | 2 | 9 | 10 | 1 | 3 | 8 | 15 | 4 | 14 | 5 | 6 | 14 | 4 | 13 |

FIGURE 6C

| To | Source States | | | | | | | | | | | | | | | |
|---|---|---|---|---|---|---|---|---|---|---|---|---|---|---|---|---|
| 32 – 47 | 2 | 6 | 10 | 14 | 18 | 22 | 26 | 30 | 34 | 38 | 42 | 46 | 50 | 54 | 58 | 62 |

FIGURE 5D

| To State | Transition Codes | | | | | | | | | | | | | | | |
|---|---|---|---|---|---|---|---|---|---|---|---|---|---|---|---|---|
| 48 | 20 | 31 | 29 | 22 | 21 | 30 | 28 | 23 | 25 | 19 | 16 | 26 | 24 | 18 | 17 | 27 |
| 49 | 16 | 27 | 25 | 18 | 17 | 26 | 24 | 19 | 29 | 23 | 20 | 30 | 28 | 22 | 21 | 31 |
| 50 | 22 | 29 | 31 | 20 | 23 | 28 | 30 | 21 | 18 | 24 | 27 | 17 | 19 | 25 | 26 | 16 |
| 51 | 18 | 25 | 27 | 16 | 19 | 24 | 26 | 17 | 22 | 28 | 31 | 21 | 23 | 29 | 30 | 20 |
| 52 | 21 | 30 | 28 | 23 | 20 | 31 | 29 | 22 | 24 | 18 | 17 | 27 | 25 | 19 | 16 | 26 |
| 53 | 17 | 26 | 24 | 19 | 16 | 27 | 25 | 18 | 28 | 22 | 21 | 31 | 29 | 23 | 20 | 30 |
| 54 | 23 | 28 | 30 | 21 | 22 | 29 | 31 | 20 | 19 | 25 | 26 | 16 | 18 | 24 | 27 | 17 |
| 55 | 19 | 24 | 26 | 17 | 18 | 25 | 27 | 16 | 23 | 29 | 30 | 20 | 22 | 28 | 31 | 21 |
| 56 | 28 | 23 | 21 | 30 | 29 | 22 | 20 | 31 | 17 | 27 | 24 | 18 | 16 | 26 | 25 | 19 |
| 57 | 24 | 19 | 17 | 26 | 25 | 18 | 16 | 27 | 21 | 31 | 28 | 22 | 20 | 30 | 29 | 23 |
| 58 | 30 | 21 | 23 | 28 | 31 | 20 | 22 | 29 | 26 | 16 | 19 | 25 | 27 | 17 | 18 | 24 |
| 59 | 26 | 17 | 19 | 24 | 27 | 16 | 18 | 25 | 30 | 20 | 23 | 29 | 31 | 21 | 22 | 28 |
| 60 | 29 | 22 | 20 | 31 | 28 | 23 | 21 | 30 | 18 | 24 | 27 | 17 | 16 | 26 | 24 | 18 |
| 61 | 25 | 18 | 16 | 27 | 24 | 19 | 17 | 26 | 22 | 28 | 31 | 21 | 20 | 30 | 28 | 22 |
| 62 | 31 | 20 | 22 | 29 | 30 | 21 | 23 | 28 | 25 | 19 | 18 | 24 | 26 | 16 | 19 | 25 |
| 63 | 27 | 16 | 18 | 25 | 26 | 17 | 19 | 24 | 29 | 23 | 22 | 28 | 30 | 20 | 23 | 29 |

| To | Source States | | | | | | | | | | | | | | | |
|---|---|---|---|---|---|---|---|---|---|---|---|---|---|---|---|---|
| 48 - 63 | 3 | 7 | 11 | 15 | 19 | 23 | 27 | 31 | 35 | 39 | 43 | 47 | 51 | 55 | 59 | 63 |

FIGURE 6D

SIMPLIFIED TRELLIS DECODER

This is a continuation of application Ser. No. 08/299,888, filed on Sep. 1, 1994, which was a continuation of application Ser. No. 08/012,525, filed on Feb. 2, 1993. Both applications are abandoned.

FIELD OF THE INVENTION

This invention relates to data communication systems and, more particularly, to an improved method for processing convolution coded data to reduce or eliminate errors caused by noise or distortion which alters the message signal during transmission.

BACKGROUND OF THE INVENTION

In a digital communication system, the received data may have been corrupted by noise and distortion. In consequence, the digital data obtained at the receiving station is not an accurate replica of the data transmitted. Such errors may be reduced by encoding the transmitted data to add redundancy to the data before transmission.

Redundancy may introduced by increasing the symbol rate. For example, error checking and error correcting codes may be appended to fixed-length blocks of source data, and the combination may then sent at a higher data rate. The resulting increase in bandwidth, however, subjects the receiver to additional noise.

Alternatively, signal-space codes may be used to add redundancy by converting the source data into a "line code" which may be sent at the same symbol rate but which uses an enlarged number of possible symbols (discrete points within the signal space). The bandwidth required by such codes is no larger than that of an equivalent uncoded system, so there is no increase in noise at the receiver. However, because the symbols must be more closely spaced to avoid an increase in transmitted power, noise immunity is reduced. In transmission systems having a limited, fixed bandwidth, such as voice-grade telephone links, signal-space coding permits significantly higher rates of error-corrected transmission to be realized.

One class of signal-space code which has enjoyed widespread acceptance because of its superior performance is the "trellis code," a convolutional code best explained using a trellis diagram. In the trellis diagram, vertical columns of nodes represent the possible states which can be assumed at successive points in time by a "state machine" which encodes the source data. Before transmission begins, the encoding machine is initialized to a predetermined state. Thereafter, each transmitted symbol specifies a transition from the current state to a limited number of permissible successor states. Thus, the sequence of symbols previously transmitted specifies the current state of the encoding machine. The current state in turn specifies which symbols out of the entire alphabet may validly appear next in the transmitted sequence. Thus, only selected sequences of transmitted symbols are permitted by the coding scheme, and these legitimate sequences may be represented by paths through the trellis diagram.

Each transmitted symbol accordingly represents not only a source codeword but also contains historical information, reflected in the state information which can be derived from the received sequence of symbols. This redundancy permits the transmitted symbol sequence to be accurately reconstructed even though noise and distortion have altered the message-bearing signal during transmission.

Trellis coding is used to particular advantage in the implementation of voiceband data modems of the type used to provide higher error-free data rates over dialup and leased-line analog telephone facilities. A trellis coding scheme described by Lee-Fang Wei in the IEEE Transactions on Information Theory, Vol. IT-33, No. 4, pp. 483–501 (July, 1983) is used to implement the CCITT V.32 standard which is widely used to provide modem data communications at 9600 baud. The V.32 standard uses a 32 point constellation within the signal space and an 8-state trellis encoder.

As described by Wei, significant improvements in coding gain may be realized with a more elaborate, more closely-spaced constellation of points in the signal space encoded by a state machine having a greater number of states. As explained by Wei, the 8-state trellis coding scheme used in the V.32 standard yields a coding gain of 4.01 db, whereas a 64-state, 4 dimensional coding scheme would provide a coding gain of 6.05 db. Unfortunately, a significantly larger computational burden is placed on the decoder to achieve this improvement. Using Wei's comparison, the 64-state, 4 dimensional code places sixteen times the computational burden on the decoding processor than does the simpler V.32 code.

Both the simpler and the more elaborate code structures may be processed using the same basic decoding method: the highly efficient Viterbi algorithm, named after its originator A. J. Viterbi, and described in the IEEE Transactions on Information Theory, Vol. IT-13, pp. 260–269 (April 1967). Nonetheless, the larger number of computational steps required to perform 64-state 4-dimensional Viterbi decoding has severely limited the extent to this larger trellis structure has been used to implement commercially practical communication systems.

SUMMARY OF THE INVENTION

It is accordingly a general object of this invention to obtain the larger coding gains provided by more complicated trellis codes without requiring substantially more computing power.

It is related object of the present invention to perform trellis decoding with fewer computing steps than required by the Viterbi algorithm. Using the principles of the invention, for example, the computational complexity required to process a 64-state, 4-dimensional trellis code sequence is reduced to only 2.75 times that required by the Viterbi algorithm when decoding industry standard V.32 sequences, at the relatively small coding gain loss of about 0.25 db in comparison to full Viterbi decoding.

In the simplified coding method contemplated by the present invention, as in the standard Viterbi decoding method, the received signal sequence is compared with an established set of legitimate sequences to determine which of the legitimate sequences most closely matches the received sequence, and the closest matching sequence is substituted for the received sequence for at the receiving station.

The simplified decoding method according to the present invention requires less computation because, unlike the full Viterbi method, it does not attempt to compare the received sequence of signal values with all possible matching symbol sequences permitted by the coding scheme. The simplified decoding method intentionally ignores, and makes no attempt to compare, paths through the trellis which have a low probability of being the best fit. This simplification substantially reduces the number of computing steps needed while incurring only a modest performance penalty in signal-to-noise performance.

In accordance with a principal feature of the invention, a path metric value associated with each decoder state is updated upon the receipt of each incoming signal value, the path metric value being formed by (1) identifying those permissible transition(s) to that decoder state which are represented by symbols having the minimum difference (or "branch metric") compared to the received signal value, (2) identifying those permissible transition(s) to that decoder state which originate from state(s) with the minimum previously-computed path metric value, and (3) comparing only those transitions identified in the first and second steps above to identify which of the identified transitions creates the lowest path metric value (derived by adding the transition's branch metric value to the previously computed path metric value for the state from which that transition is made).

In a modified version of the simplified decoding method according to the present invention, the computation is made slightly more elaborate by considering not only the transition having the smallest branch metric but also the transition having the second smallest branch metric, resulting in a somewhat higher computational burden (about 4 times the 8-state V.32 complexity being needed to decode a 64-state, 4 dimensional trellis code) but improving the signal-to-noise performance to a level essentially equal to that of conventional, full Viterbi decoding.

The decoding method contemplated by the present invention is preferably implemented by means of a programmed microprocessor, as shown for instance in FIG. 8, which processes digitally expressed incoming signal values in accordance with the decoding method to produce a replica of the originally transmitted data. Because such a processor may be exposed to computational demands apart from those imposed by the decoding method, the present invention's ability to reduce the computational burden may be used selectively as needed. For example, decoding may performed under normal conditions using the more elaborate, but still simplified decoding method. Then, when it is necessary to perform additional computations concurrently with continued decoding, the more highly simplified method may be employed (with an acceptable performance degradation) until full processing power is again available.

These and other objects, features and advantages of the present invention may be better understood by considering the following detailed description of the invention.

BRIEF DESCRIPTION OF THE DRAWINGS

FIG. 5a through 5d combined constitute a table listing the values of the codes associated with the sixteen transitions to each of the 64 states in a 64 state, 4 dimensional trellis;

FIG. 6a through 6d combined constitute a table listing the source states from which transitions are possible to each of the 64 states in a 64 state, 4 dimensional trellis.

DETAILED DESCRIPTION

In order to more fully understand the principles of the present invention, it will be helpful to set forth a simplified example of trellis coding and the operation of the Viterbi decoding method with reference to this simplified example; and then, the operation of the simplified decoding method contemplated by the invention will be explained using the same simplified example.

Trellis Coding

As an example, assume that messages will be sent within a signal space L, and that any two signal values within the signal space L are separated by a metric value $\mu$. For any two elements $e_1$ and $e_2$ from L, the metric $\mu(e_1, e_2)$ is a real number equal to the minimum square euclidean distance between the elements. In practical transmission systems, the signal space may take a variety of forms: it may consist of a one dimensional range of analog signal amplitudes, or a multidimensional space characteristic of frequency-shift-keying systems commonly used for modem communication. An example of data transmission system of the class to which the present invention may be applied to advantage may be found in the 9600 baud HST modem manufactured by U.S. Robotics Corporation and described in U.S. Pat. No. 5,008,901 issued on Apr. 16, 1991. This arrangement provides high-speed trellis code reception using a conventional Viterbi algorithm, the receiver processing being implemented by one of three microprocessors which is devoted primarily to the translation of digitally-expressed sample amplitude values produced by an analog-to-digital converter into a replica of the original digital data coded by a comparable modem at the transmitting end of a voice-grade telephone link. In this case, the "signal space" available is provided by a 2400 baud phase-shift-keyed transmission medium.

Figure 1:
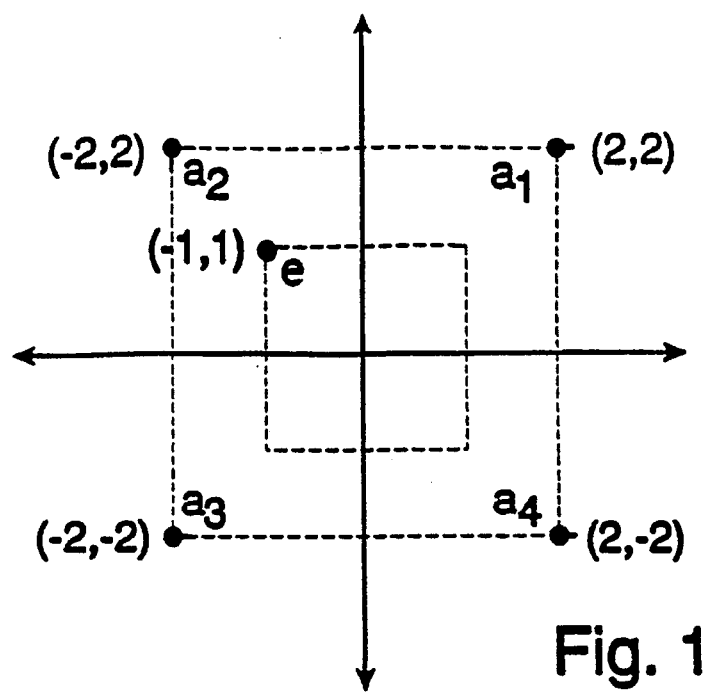
FIG. 1 is a graph of the signal space occupied by a four exemplary symbols making up simple alphabet used to illustrate trellis coding generally.

Information to be transmitted within the signal space L may be encoded by any suitable means into a sequence of transmitted symbols selected from an $A=\{a_1, a_2, \ldots, a_N\}$ with N codewords represented as N points within the signal space L. An example, shown in FIG. 1 of the drawings, is a 2-dimensional Euclidean signal space L within which four discrete points are defined forming an alphabet $A=\{a_1, a_2, a_3, a_4\}$, where $a_1=(2, 2)$, $a_2=(-2, 2)$, $a_3=(-2, 2)$, and $a_4=(2, -2)$.

At the transmitting station, these symbols from the alphabet A are generated by a coder which takes the form of a state machine capable of assuming the states $S=\{s_1, s_2, s_3, s_4\}$. From any state, there is at least one state to which a transition can be made. Further assume that a rule t defines a transition from each state and that this transition is represented by a symbol from alphabet A. Thus, the next state in the state machine is determined by the machine's present state and a codeword of the alphabet, $t(s_i, s_j)=a_k$. For the example trellis coding system as illustrated in FIG. 2, the rule t governing state changes is defined as:

$t(S_1, S_1)=a_1$ $t(S_2, S_1)=a_3$ $t(S_3, S_2)=a_4$ $t(S_4, S_2)=a_2$
$t(S_1, S_3)=a_3$ $t(S_2, S_3)=a_1$ $t(S_3, S_4)=a_2$ $t(S_4, S_4)=a_4$

Figure 2:
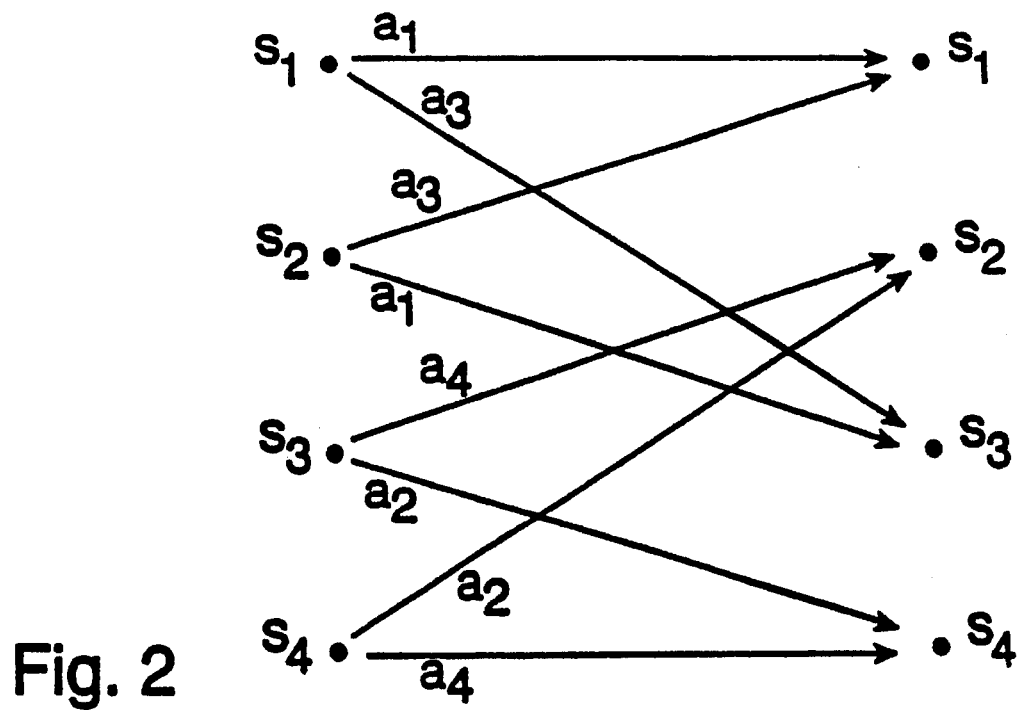
FIG. 2 is a trellis diagram for the alphabet of FIG. 1 used to further illustrate trellis coding.

The trellis diagram seen in FIG. 2 shows the permissible transitions from one state to other states which are defined for the particular coding scheme shown. These transitions, sometimes called branches, are characterized by the state the transition leaves, the state it enters, and a symbol from the alphabet which uniquely represents that transition: that is, all transitions from states $S_1$ to state $S_3$ will be associated with the transmission from the coder of the symbol $a_3$.

The sequence of states accordingly dictates the sequence of symbols from the alphabet A that are transmitted. The sequence of states is graphically represented by a path through the trellis. The "branch metric" may be defined as the metric (Euclidian distance) between some point within the signal space L (such as the value of a received signal at a given time) and the point represented by a symbol from alphabet A. Thus the branch metric between the point e in FIG. 1 at (−1,1) and the point $a_3$ (−2, −2) is the minimum squared Euclidian distance $=(-1-(-2))^2+(1-(-2))^2=1+9=10$. The "path metric," on the other hand, is defined as the sum of the branch metrics between a legitimate path through the trellis and the actual signal values received (the result of the modification, by noise or distortion, of a sequence of symbols transmitted (which exactly matched a legitimate path through the trellis at the transmitting end of the channel).

Figure 3:
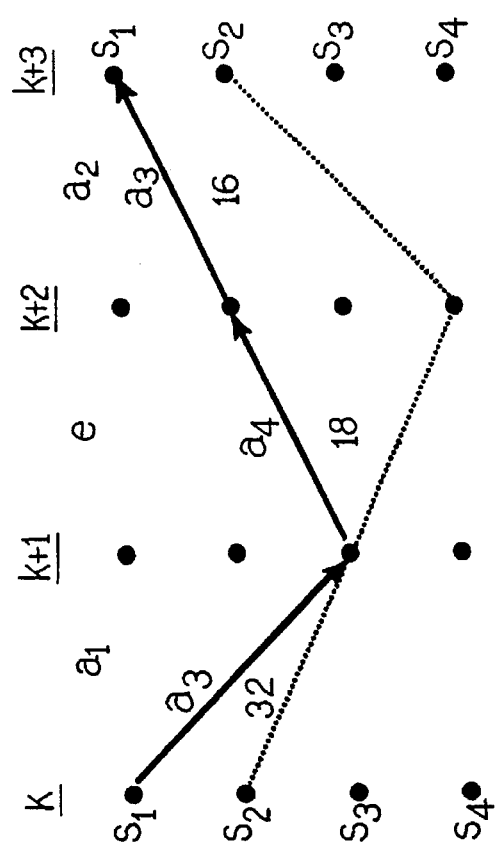
FIG. 3 is a graph of example state transitions used to illustrate the general principles of trellis decoding.
Figure 7:
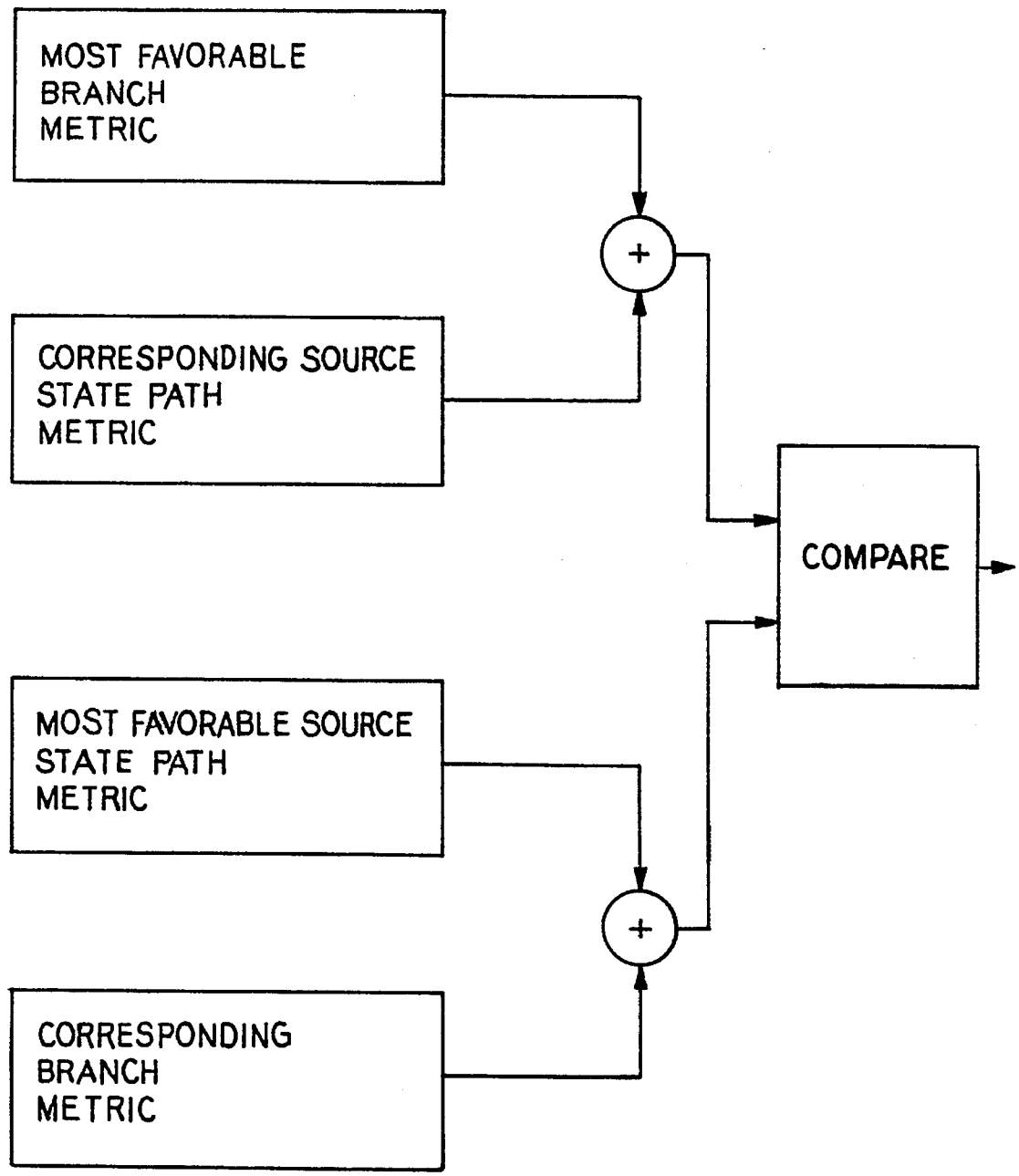
FIG. 7 is a flow chart showing the present invention.
Figure 8:
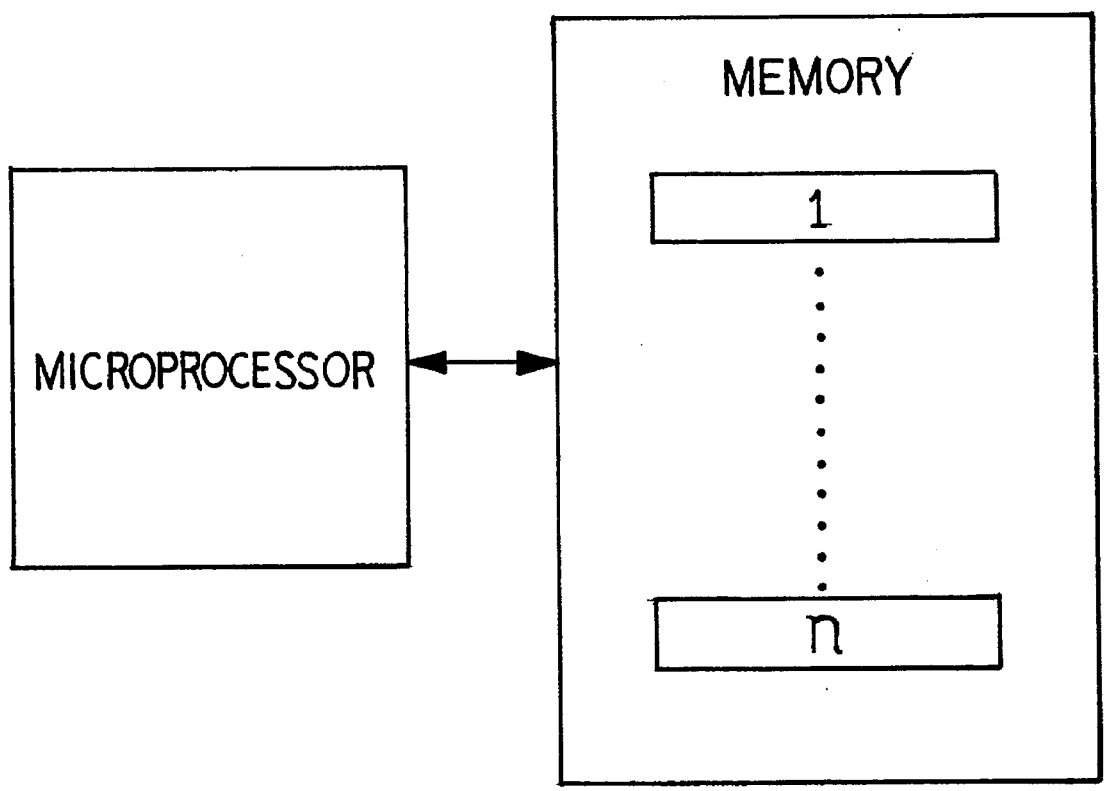
FIG. 8 is a block diagram illustrating a microprocessor and memory in accordance with the present invention.

Suppose next that the following observed input sequence of elements is to be decoded: $(a_1, e, a_2)$ where e is the element (−1, 1) seen in FIG. 1. As illustrated in FIG. 3, decoding may be accomplished by computing the path metric for each of the states $(S_1, S_3, S_2, S_1)$, considering all of the possible paths the decoder might consider. The sequence of branches, or symbols from alphabet A, associated with the path indicated by the solid line transitions seen in FIG. 3, is $(a_3, a_4, a_3)$, because $t(S_1, S_3)=a_3$, $t(S_3, S_2)=a_4$, and $t(S_2, S_1)=a_3$. The branch metrics are $\mu(a_1, a_3)=32$, $\mu(e, a_4)=18$, and $\mu(a_2, a_3)=16$. Thus the path metric for sequence of states $(S_1, S_3, S_2, S_1)$ is $32+18+16=66$.

For any given sequence of elements to be decoded in signal space L, the decoding method chosen must search the trellis for that path which most closely fits the observed sequence of received signal points, that is, the path having the most favorable (e.g., the minimum) path metric. In this example, the path through the trellis diagram that has the minimum path metric compared to the received sequence of signal values is deemed to be the most probable correct symbol sequence. There are 16 possible paths through the trellis seen in FIG. 2, and the direct searching technique illustrated in FIG. 3 yields the answer: $(a_1, a_2, a_2)$ with the path $(S_2, S_3, S_4, S_2)$ and its metric being equal to 20.

The Viterbi Algorithm

The number of possible paths grows exponentially with the length a sequence. Thus the direct search approach for determining the path with the most favorable path metric is impractical. A computationally efficient method is needed. The most widely used solution of the problem is the Viterbi algorithm for sequence detection described in the 1976 IEEE paper noted earlier. The Viterbi algorithm is a procedure that purges from consideration code paths that can not possibly constitute the best fit with the received signal values.

The Viterbi algorithm defines a set of states $S_i=\{S_{i1}, S_{i2}, \ldots, S_{im}\}$ as all states from which state $S_i$ can be entered. Also, a set of branches or codewords from alphabet A, $T_i=\{a_{i1}, a_{i2}, \ldots, a_{im}\}$ is defined as all transitions associated with the set of states $S_i$ such that $t(S_{ij}, S_i)=a_{ij}$. A trellis diagram can be defined explicitly by the $S_i$ and $T_i$ for each node (state) of the trellis. In the following example, the method of the Viterbi algorithm is applied to the trellis shown in FIG. 2.

For the trellis of the previous examples $S_1=\{S_1, S_1\} T_1=\{a_1, a_3\}$
$S_2=\{S_3, S_4\} T_2=\{a_4, a_2\}$
$S_3=\{S_1, S_2\} T_3=\{a_3, a_1\}$
$S_4=\{S_3, S_4\} T_4=\{a_2, a_4\}$.

Assume we have a sequence $(e_1, e_2, \ldots)$, a trellis diagram with N states defined by $S_i$ and $T_i$ for each node, and an alphabet $A=\{a_1, a_2, \ldots, a_k\}$ with K codewords. The Viterbi method of sequence detection proceeds as follows:

Step V0 [Initialization]

All of the path metric values for all of the states are initialized to a predetermined value. For example, if $P_n$ is the path metric of the path that ends at state $S_n$, the values $p_1$ through $p_N$ inclusive may be set to zero.

Step V1 [Compute branch metrics]

For each element $e_1$ of the received signal sequence, the "branch metric" (mean squared Euclidian distance) is computed between $e_1$ and every codewords of the alphabet $A=\{a_1, a_2, \ldots, a_k\}$. Thus, the distance $d_1=\mu(e_1, a_1), \ldots, d_k=\mu(e_1, a_k)$.

Step V2 [Compute new path metrics]

Each state can be reached by valid transitions from a set of predecessor states. Thus state 1 may be reached from a set of states $S_1=\{S_{i1}, S_{i2}, \ldots, S_{im}\}$ and the valid transitions to state 1 may be noted by the set of transitions (and the symbols which represent those transitions) by the notation $T_1=\{a_{i1}, a_{i2}, \ldots, a_{im}\}$. At this step of the Viterbi decoding method, new path metrics $P_{(new)i}$ are computed for all of the valid paths that end at a given state. Thus, for state 1, $P_{new1}=P_{i1}+d_{i1}, P_{new2}=P_{i2}+d_{i2}, \ldots, P_{newm}=P_{im}+d_{im}$. Thus, at the end of this step V2, the total path metric value has been computed for every path terminating at the given stage.

Step V3 [Find the minimum path metric for the state $S_n$]

In this step, all of the path metric values of the paths terminating at a state are compared, and the minimum among these values $P_{new1}, \ldots, P_{newm}$ is designated and saved as the new path metric for that state. The rest are discarded. The identification of the state from the most favorable (best fitting) path arrived at the given state (or the symbol designating that last transition) is also saved for possible use as part of the ultimate reconstructed output sequence.

Step V4. [Repetition]

Steps V2 and V3 above are repeated for each of the N trellis states.

Step V5. [Assign new path metrics]

The most favorable path metrics identified in the comparison step V3 for each of the trellis states are assigned to those states for use in connection with the analysis of the next incoming signal value: $P_1=P_{min1}$, $P_2=P_{min2}$, ..., $P_n=P_{minN}$.

Step V6. [Shift to the next element]

The next element of the incoming signal sequence is analyzed by repeating the steps from V1 to V6. The algorithm stops at the end of the sequence and the final decision is made, selecting as the best fitting path the one having the most favorable (e.g. the smallest) path metric at the end of the conclusion of the processing.

Example Viterbi Processing

Applying the Viterbi algorithm to analyze the input sequence $(a_1, e, a_2)$ described in the foregoing examples, the processing proceeds as follows:

First pass:
Step V0.
$p_1=p_2=p_3=p_4=0$
Step V1.
Take element $a_1$ of the sequence. Find all distances between $a_1$ and the codewords of the alphabet $A=(a_1, a_2, a_3, a_4)$:
$d_1=\mu(a_1, a_1)=0$, $d_2=\mu(a_1, a_2)=16$,
$d_3=\mu(a_1, a_3)=32$, $d_4=\mu(a_1, a_4)=16$.
Steps V2–V4.

$S_1=\{S_1, S_2\}$, $T_1=\{a_1, a_3\}$
$P_{new1}=P_1+d_1=0$, $P_{new2}=P_2+d_3=32$
$P_{min1}=P_{new1}=0$, keep $(S_1, S_1)$
$S_2=\{S_3, S_4\}$, $T_2=\{a_4, a_2\}$
$P_{new1}=P_3+d_4=16$, $P_{new2}=P_4+d_2=16$
$P_{min2}=P_{new1}=16$, keep $(S_3, S_2)$
$S_3=\{S_1, S_2\}$, $T_3=\{a_3, a_1\}$
$P_{new1}=P_1+d_3=32$, $P_{new2}=P_2+d_1=0$
$P_{min3}=P_{new2}=0$, keep $(S_2, S_3)$
$S_4=\{S_3, S_4\}$, $T_4=\{a_2, a_4\}$
$P_{new1}=P_3+d_2=16$, $P_{new2}=P_4+d_4=16$
$P_{min4}=P_{new1}=16$, keep $(S_3, S_4)$
Step V5.
Compute new path metrics:
  $P_1=P_{min1}=0$, $(S_1, S_1)$ is kept
  $P_2=P_{min2}=16$, $(S_3, S_2)$ is kept
  $P_3=P_{min3}=0$, $(S_2, S_3)$ is kept
  $P_4=P_{min4}=16$, $(S_3, S_4)$ is kept
Second pass:
Step V1.
Take element e of the sequence. Find all distances between e and the codewords of the alphabet $A=(a_1, a_2, a_3, a_4)$:
  $d_1=\mu(e, a_1)=10$, $d_2=\mu(e, a_2)=2$,
  $d_3=\mu(e, a_3)=10$, $d_4=\mu(e, a_4)=18$.
Steps V2–V4.
$S_1=\{S_1, (S_2\}, T_1, a_3\}$
$P_{new1}=P_1+d_1=10$, $P_{new2}=P_2+d_3=26$
$P_{min1}=P_{new1}=10$, keep $(S_1, S_1, S_1)$
$S_2=\{S_3, S_4\}$, $T_2=\{a_4, a_2\}$
$P_{new1}=P_3+d_4=18$, $P_{new2}=P_4+d_2 17$
$P_{min2}=P_{new2}=17$, keep $(S_3, S_4, S_2)$
$S_3=\{S_1, S_2\}$, $T_3=\{a_3, a_1\}$
$P_{new1}=P_1+d_3=10$, $P_{new2}=P_2+d_1=26$
$P_{min3}=P_{new1}=10$, keep $(S_1, S_1, S_3)$
$S_4=\{S_3, S_4\}$, $T_4=\{a_2, a_4\}$
$P_{new1}=P_3+D_2=1$, $P_{new2}=P_4+d_4=34$
$P_{min4}=P_{new1}=1$, keep $(S_2, S_3, S_4)$
Step V5.
Compute new path metrics:
  $P_1=P_{min1}=10$, $(S_1, S_1, S_1)$ is kept
  $P_2=P_{min2}=17$, $(S_3, S_4, S_2)$ is kept
  $P_3=P_{min3}=10$, $(S_1, S_1, S_3)$ is kept
  $P_4=P_{min4}=1$, $(S_2, S_3, S_4)$ is kept
Last pass:
Step V1.
Take element $a_2$ of the sequence. Find all distances between $a_2$ an the codewords of the alphabet $A=(a_1, a_2, a_3, a_4)$:
  $d_1=\mu(a_2, a_1)=16$, $d_2=\mu(a_2, a_2)=0$,
  $d_3=\mu(a_2, a_3)=16$, $d_4=\mu(a_2, a_4)=32$.
Steps V2–V4
$S_1=\{S_1, S_2\}$, $T_1=\{a_1, a_3\}$
$P_{new1}=P_1+d_1=26$, $P_{new2}=P_2+d_3=33$
$P_{min1}=P_{new1}=26$, keep $(S_1, S_1, S_1, S_1)$
$S_2=\{S_3, S_4\}$, $T_2=\{a_4, a_2\}$
$P_{new1}=P_3+d_4=42$, $P_{new2}=P_4+d_2 1$
$P_{min2}=P_{new2}=1$, keep $(S_2, S_3, S_4, S_2)$
$S_3=\{S_1, S_2\}$, $T_3=\{a_3, a_1\}$
$P_{new1}=P_1+d_3=26$, $P_{new2}=P_2+d_1=33$
$P_{min3}=P_{new1}=26$, keep $(S_1, S_1, S_1, S_3)$
$S_4=\{S_3, S_4\}$, $T_4=\{a_2, a_4\}$
$P_{new1}=P_3+d_2=10$, $P_{new2}=P_4+d_4=33$
$P_{min4}=P_{new1}=10$, keep $(S_1, S_1, S_2, S_4)$
Step V5.
Compute new path metrics:
  $P_1=P_{min1}=26$, $(S_1, S_1, S_1, S_1)$ is kept
  $P_2=P_{min2}=1$, $(S_2, S_3, S_4, S_2)$ is kept
  $P_3=P_{min3}=26$, $(S_1, S_1, S_1, S_3)$ is kept
  $P_4=P_{min4}=10$, $(S_1, S_1, S_3, S_4)$ is kept Thus the answer is the path $(S_2, S_3, S_4, S_2)$ with the paths metric 1. The corresponding sequence is $(a_1, a_2, a_2)$. As seen above, the Viterbi algorithm purges from consideration code paths that can not possibly be the best fit. However, it never purges the best fit path. Although this method realizes the full potential of the coding scheme, it is so computationally intensive that its application is limited to relatively high-speed computers.

The Simplified Trellis Decoder

The simplified trellis decoder of this invention chooses the candidate for path extension from among only two candidates instead of from among all possible candidates as in the Viterbi decoder. It purges from consideration all paths except a certain number that it determines most likely to include the best fit path. In doing so, there is a finite probably of purging the best fit path. This finite probability accounts for a small performance difference in the coding gain, approximately 0.25 db for a 64 state, 4D trellis decoder, between method of this invention and the Viterbi algorithm. This difference in coding gain can be viewed as a decrease in the signal power allowable in the coded system for a fixed noise power, or an increase in the allowable noise power for a fixed signal power. the steps of the simplified trellis decoding method may be summarized as follows:

Step STDO [Initialization]

As in the case of the Viterbi method, a path metric $P_n$ a path metric value for each of the N decoder states is initialized, by $P_1$ through $P_N$ being set to zero.

Step STD1 [Compute branch metrics]

Again, as with the Viterbi method described above, assuming a sequence of input signal values is to be decoded, beginning with the first element $e_1$ of the sequence, the branch metrics are computed for the element $e_1$ compared with all of the codewords of the alphabet $A=\{a_1, a_2, \ldots, a_k\}$:
$d_1=\mu(e_1, a_1), \ldots, d_k=\mu(e_1, a_k)$.

Step STD2 [Find the minimums among the branch and path metrics]

In this step, the transition(s) having the most favorable branch metric value is selected from all of the transitions which terminate at a given state. Typically, but not necessarily, the most favorable branch metric value are the minimum value(s) among the several branch metric value are the minimum value(s) among the several branch metric values which are associated with transitions to a given state. If, for any given state, more than one incoming transitions have the same (minimum) branch metric, all of these transitions are identified for further processing.

At this point, the computation may be made slightly more elaborate by identifying for further processing not only the transition(s) having the most favorable (e.g. minimum) branch metrics but also the transition(s) having the next most favorable (e.g., second smallest) branch metric. This increase in computational burden (about 4 times the 8-state V.32 complexity being needed to decode a 64-state, 4 dimensional trellis code) improves the signal-to-noise performance to a level essentially equal to that of conventional, full Viterbi decoding. In accordance with a feature of the invention, the tradeoff between accuracy and computational burden may be varied in real time as the data is being received. For example, when the processor performing the decoding is experiencing heavier computational loads, only the transitions associated with the smallest branch metric are retained whereas, when greater computational power is available, both the smallest and next to smallest branch metric transitions are retained for further processing.

Also, in this step, all of the states from which transitions to the given state are permitted are compared, and those state(s) having the minimum path metric $P_{partial\_}^{Min1}$ are identified. Again, if more than one permitted transitions are found from states having the same (minimum) transition, all of these minimum pathways are identified for further processing.

Step STD3 [Compute new path metric]

In this step, the transitions associated with either the minimum branch metric or the minimum source state path metric are compared as follows: the total path metric for each such candidate path is calculated by adding its branch metric and the path metric of the state from which it arrives at the given state.

Step STD4. [Find the minimum path metric for the state $S_n$]

Find the minimum total path metric among the candidates calculated in step STD3, above, designate it as the new path metric for that state, and discard the rest. Save the identification of the state from which emerges the branch, associated with the minimum.

Step STD5. [Repetition]

Repeat steps STD3 and STD4 for each of the trellis states.

Step STD6. [Assign new path metrics]

Reassign the minimum path metric values found in step STD4 to the corresponding states in preparation for processing the next incoming signal value.

Step STD7. [Shift to the next element]

Take next element of the sequence and repeat steps from STD1 to STD7.

Performance Comparison

The performance of the simplified trellis decoding method contemplated by the present invention may be quantified by comparing the number of operations (additions or comparisons) necessary for performing steps V2 through V4 for Viterbi algorithm, and STD2 through STD5 for STD method. In order to find the minimum among N numbers we need N operations. If the trellis has N states, and there are M branches entering each state, and there are K codewords in the alphabet A, then the number of operations for the Viterbi algorithm is 2MN, since there are M additions and M comparisons for each node.

The number of operations for the simplified algorithm is determined as follows: using the same assumptions, there K+N comparisons for step STD2 and 2 additions and 2 comparisons for each node. Accordingly, the total number of operations is K+N+4N=5N+K.

Figure 4:
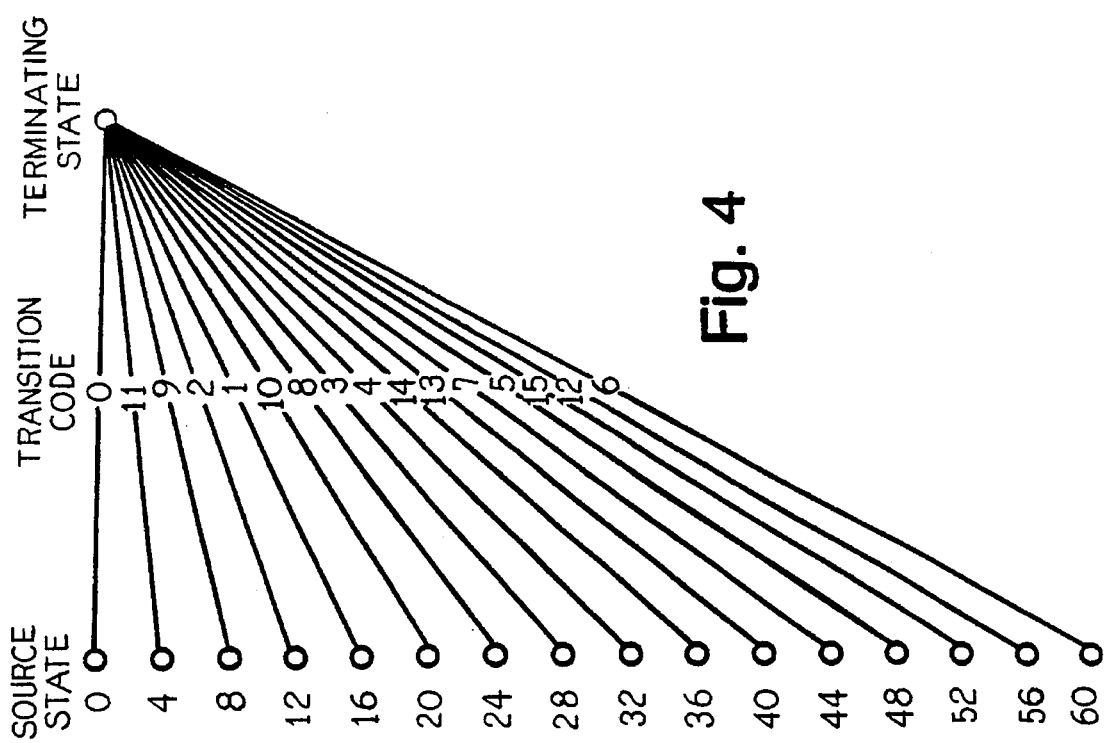
FIG. 4 is a chart showing the 16 possible transitions which terminate at state 0 in a 64 state, 4 dimensional trellis.

The 64 state, 4 dimensional trellis is illustrated for the terminating state 0 by FIG. 4 of the drawings. Sixteen transitions (lines in the trellis diagram) converge at each state. As seen in FIG. 4, the transitions terminating at state 0 are associated with the transmitted code values: 0, 11, 9, 2, 1, 10, 8, 3, 4, 14, 13, 7, 5, 15, 12 and 6. These 16 transitions originated respectively at the source states 0, 4, 8, 16, 20, 24, 28, 32, 36, 40, 44, 48, 52, 56 and 60. The sixteen transition codes which terminate at each of the states 0–63 are shown in the tables, FIGS. 5a through 5d. The sixteen source states which correspond to these transitions are shown in the tables which appear as FIGS. 6a through 6d. Since there are 64 states (N=64), 16 branches into each state (M=16) and 32 codewords (0–31) in the alphabet (K=32), the Viterbi method requires 2×64×16=2048 operations while the simplified scheme requires (5×64)+32=362 operations. In this case, the simplified method requires 5.8 times fewer operations than the standard Viterbi method.

It is to be understood that the decoding methods which have been described are merely illustrative of one application of the principles of invention and that numerous modifications may be made to the specific methods disclosed without departing from the true spirit and scope of the invention.

What is claimed is:

1. A method of translating signal values received over an error-prone communications channel into a replica of an original transmitted sequence of symbol values, each transmitted symbol value in said original transmitted sequence being selected from a predetermined alphabet of symbol values, each transmitted symbol value being representative of a transition between two of plural possible process states as defined by a coding scheme in which only selected state-to-state transitions are allowed and each of said allowed transitions is uniquely represented by one of said symbol, values said method comprising, in combination, the steps of:

deriving and storing a path metric value associated with each given one of said plural process states by performing, for each such given state, the substeps comprising, in combination:

selecting a limited number of candidate transitions, said limited number being less than all possible valid transitions, said step of selecting the limited number of candidate transitions comprised of selecting, as first candidate transitions from those allowed transitions which terminate at said given state, those transitions which originated from a predecessor state associated with the most favorable previously stored path metric value, producing, for each given one of said allowed transitions, a branch metric value representing the difference between the value of the symbol representing said one allowed transition and the value of the corresponding symbol in said sequence as received over said channel, selecting, as second candidate transitions, those transitions having the most favorable branch metric value, calculating for each of said first and second candidate transitions the combined value of said branch metric value and the path metric value previously stored for the state at which said transition originated, comparing said combined values to select that candidate transitions having the most favorable combined value, saving said most favorable combined value as the new path metric for said given state, and saving an identification of the selected candidate transition having the most favorable combined value; and sequentially tracing a connected chain of a plurality of said selected transitions from a current one of states to produce a decoded output symbol corresponding to a prior transition in said chain.

2. The method set forth in claim 1 wherein said step of selecting said second candidate transitions further comprises additionally including among with said second candidate transitions those transitions having the next-to-most-favorable branch metric value.

3. The method set forth in claim 1 wherein said step of selecting said second candidate transitions further comprises additionally including among with said second candidate transitions those transitions having the next-to-most-favorable path metric value.

4. The method set forth in claim 1 wherein said step of selecting said second candidate transitions further comprises the steps of:

accepting a control signal indicating a request for additional decoding accuracy, and additionally including among with said second candidate transitions those transitions having the next-to-lowest branch metric value whenever said control signal appears.

5. The method set forth in claim 1 wherein said most favorable path metric and branch metric values are the smallest values, and wherein said combined values are sums formed by adding a branch metric value to a previously stored path metric value, and wherein said most favorable combined value is the smallest combined value.

6. An apparatus for decoding data received over an communication link, said data being encoded prior to transmission in accordance with a code represented by a trellis in which each transmitted symbol is representative of an allowed transition from an originating state to a terminating state of an n-state coding device, said apparatus comprising, in combination:

n storage locations, each corresponding to one state of said n-state coding device, for storing a path metric value for said one state;

means for storing a received symbol within the data received over said communication link;

means for identifying a limited number of subjects of transitions for each of said states, said limited number being less than all possible valid transitions, said means for identifying including:

means for identifying, from the sent of allowed transitions which terminate at a given state, a first predetermined size subset of transitions comprising those transitions which originate from states having the lowest currently stored path metric value, and means for identifying, from the set of allowed transitions which terminate at each state, a second predetermined size subset of transitions comprising those transitions which are represented by symbols whose values are closest to said received symbol;

means for calculating, for each given transition within said first and second subsets, a temporary path metric value equal to the sum of the stored path metric values for the state at which said path metric originated added to the difference between the value of the symbol representing said given transition and the value of said received symbol;

means for replacing the path metric value in each of said n storage locations with the lowest temporary path metric value calculated for the state associated with that storage location;

means for storing the identification of a chosen transition associated with said lowest temporary path metric value; and means for generating as decoded data a sequence of symbols associated with previous transitions within a connected chain which terminate at a selected one of said states.

7. The apparatus set forth in claim 6 wherein said selected one of said states is the state associated with the lowest calculated path metric value among all of said n states.

8. The apparatus as set forth in claim 6 wherein said means for identifying said second subset comprises means for additionally including in said first subset those further transitions represented by symbols which originate from states having the second-lowest currently stored path metric value.

9. The apparatus as set forth in claim 6 wherein said means for identifying said second subset comprises means for additionally including in said second subset those additional transitions represented by symbols having values which are next-closest to the value of said received symbol.

10. The apparatus as set forth in claim 8 further comprising means responsive to a control signal for increasing the accuracy of decoding by activating said means for additionally including said further transitions in said first subset.

11. The apparatus as set forth in claim 9 further comprising means responsive to a control signal for increasing the accuracy of decoding by activating said means for additionally including said additional transitions in said second subset.

\* \* \* \* \*